United States Patent
Yamamoto et al.

Patent Number: 5,372,648
Date of Patent: Dec. 13, 1994

[54] PLASMA CVD SYSTEM

[75] Inventors: Shigeyuki Yamamoto, Nara; Yuichiro Yamada, Suita; Ryuzoh Hohchin, Hirakata; Hiroshi Tanabe, Yamatotakada; Tomohiro Okumura, Hirakata, all of Japan

[73] Assignee: Matsushita Electric Industrial Co., Ltd., Osaka, Japan

[21] Appl. No.: 54,137

[22] Filed: Apr. 30, 1993

[30] Foreign Application Priority Data

Apr. 30, 1992 [JP] Japan .................... 4-111084

[51] Int. Cl.[5] ............................................. C23C 16/50
[52] U.S. Cl. ................... 118/723 E; 118/719; 118/725; 118/729
[58] Field of Search ............... 118/723 E, 723 E R, 118/724, 725, 729

[56] References Cited

U.S. PATENT DOCUMENTS

| | | |
|---|---|---|
| 4,909,183 | 3/1990 | Kamiya et al. .................. 118/723 E |
| 4,979,467 | 12/1990 | Kamaji et al. ................... 118/723 E |
| 5,304,248 | 4/1994 | Cheng et al. ......................... 118/728 |

FOREIGN PATENT DOCUMENTS

63-114118  5/1988  Japan .

*Primary Examiner*—R. Bruce Breneman
*Assistant Examiner*—Jonathan D. Baskin
*Attorney, Agent, or Firm*—Wenderoth, Lind & Ponack

[57] ABSTRACT

A plasma CVD system has a processing chamber having a thin film forming section, and a transfer section communicating with the thin film forming section through a connecting opening. The system includes a thin film forming device, located in the thin film forming section, for producing plasma to form a thin film on a substrate at the connecting opening, a transfer device, located in the transfer section, for bringing a substrate holding member into and out of the processing chamber, and a heat transfer plate which does not project beyond the edge of the substrate when moved into abutment against a rear face of the substrate held by the substrate holding member to move the substrate from the substrate holding member towards the thin film forming section. The heat transfer plate also conducts heat to the substrate.

9 Claims, 9 Drawing Sheets

PLASMA CVD SYSTEM

BACKGROUND OF THE INVENTION

The present invention generally relates to a plasma CVD system, and more particularly to a plasma CVD system suitable for forming thin films onto relatively large substrates by the plasma CVD technique.

Conventionally, a plasma CVD system has been utilized to form a thin film for a relatively small substrate such as a silicon substrate for semiconductor devices. However, it is a recent trend to use the plasma CVD system to form a thin film to a substrate of a large area, e.g., a large-scale liquid crystal panel or the like. Moreover, although most of the conventional plasma CVD system is of a type processing for every predetermined number of substrates at one time in a so-called batch processing, such a system has been developed lately that automatically handles the substrates, that is, sequentially sends the substrates to a processing chamber to continuously perform a film forming process, a heating process as a pretreatment, and a cooling process as a posttreatment.

Figure 6:
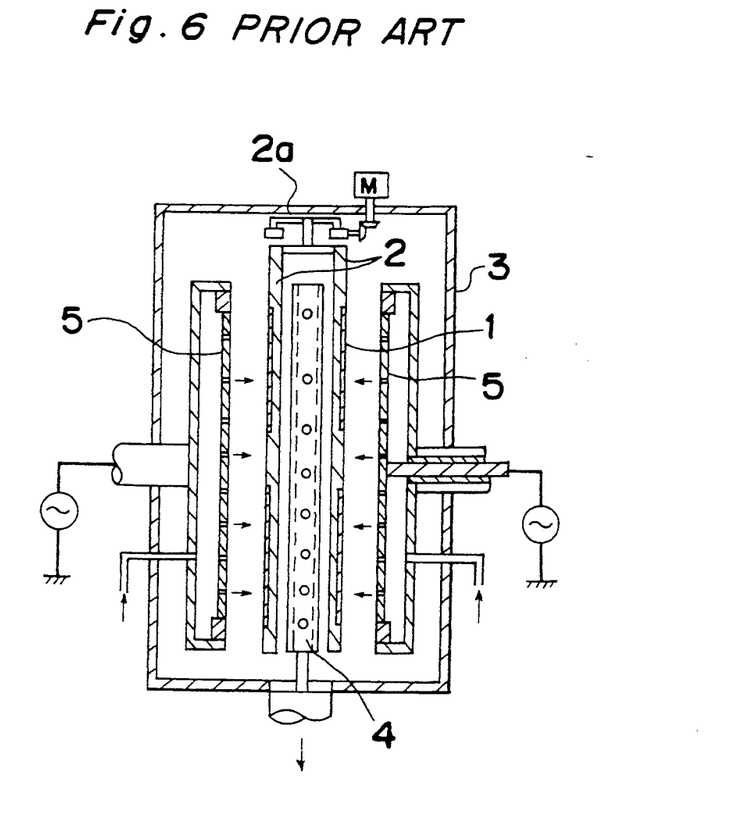
FIG. 6 is a sectional view showing the structure of a conventional plasma CVD system.

In FIG. 6 is shown the structure of a plasma CVD system used heretofore in the manufacture of large scale liquid crystal panels. A plurality of substrates 1 each formed of glass or the like are held by a pair of right and left trays 2. The substrate trays 2 are mounted to a conveyor 2a driven via a motor and a gear mechanism. The substrates 1 while mounted to the trays 2 are sequentially and continuously sent to a processing chamber 3 and sent out from the chamber 3 after the treatment is completed. A sheathed heater panel 4 is provided in the gap between the right and left trays 2 in the processing chamber 3, which heats the substrates 1 from the rear side. At the same time, a gas exhaust plate 5 serving also as an electrode is provided at the right and left outside of the substrate tray 2. The gas exhaust plate 5 is connected to a high frequency power source. Reaction gas is fed into the rear space of the gas exhaust plate 5. When the reaction gas is jetted out to the substrate 1 from the front side of the gas exhaust plate 5 as a voltage is impressed between the gas exhaust plate 5 and the substrate tray 2, a thin film is formed on the surface of the substrate 1.

Figure 7:
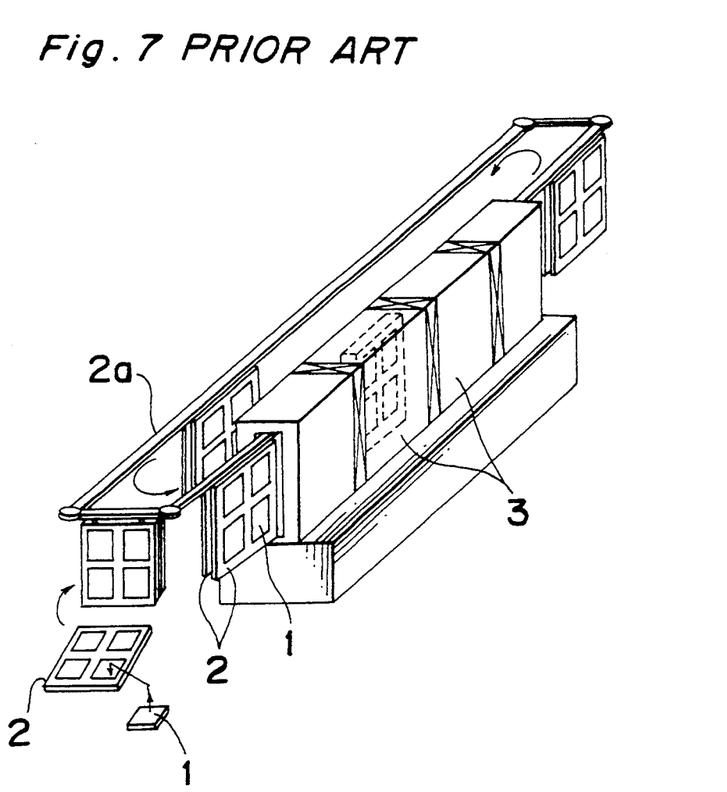
FIG. 7 is a perspective view showing the appearance of the system of FIG. 6.

Referring to FIG. 7, in the case where a plurality of processing chambers 3 are arranged side by side, the conveyor 2a is arranged in the form of a loop to circulate through the plurality of processing chambers 3. As indicated at the lower left in FIG. 7, the substrate tray 2 is suspended from the conveyor 2a after the substrates 1 are set on the substrate tray 2. When the conveyor 2a is started, the substrate tray 2 is passed through each processing chamber 3, where a predetermined treatment is performed to the substrates 1.

The conventional plasma CVD system of the above-described type accompanies an unfavorable problem that a thin film is formed on the substrate tray, drops and adheres to the surface of the substrate, thereby deteriorating the quality of the substrate surface.

More specifically, in the above plasma CVD system, a thin film is formed both on the substrate tray 2 and on the substrate 1. Since the substrate tray 2 is repeatedly used while circulating and moving in each processing chamber 3 and the external space, the tray is subjected to heating, vacuum heating, film formation, and cooling for every processing cycle and accordingly affected by the severe change of the temperature and atmospheric pressure. As a result, the thin film adhered to the substrate tray 2 is delaminated, i.e., scaling is caused. If the thin film detached from the substrate tray 2 adheres to the surface of the substrate 1, the surface quality of the substrate 1 is worsened. Moreover, a thin film is formed also on the surface of the structural member such as a transfer device, e.g., conveyor 2a or the like, and is slipped off as well.

Although it is good to remove the thin film adhered to the substrate tray 2 or the transfer device so as to prevent the adhesion of the delaminated thin film to the surface of the substrate 1, the removal requires considerably much time and labor, thus lowering the operation rate of the plasma CVD system and increasing the maintenance cost.

SUMMARY OF THE INVENTION

An object of the present invention is to provide an improved plasma CVD system which prevents adhesion of a delaminated thin film to the surface of a substrate with high operation rate of the system and reducing of maintenance cost without any time and labor.

In accomplishing these and other objects, according to one aspect of the present invention, there is provided a plasma CVD system having a processing chamber having a thin film forming section and a transfer section communicated with the thin film forming section through a connecting opening, and comprising: a thin film forming device, located in the thin film forming section, for supplying reaction gas in the thin film forming section to produce plasma by applying a voltage and form a thin film on a substrate at the connecting opening; a transfer device, located in the transfer section, for bringing in and out a substrate holding member for holding the substrate to the processing chamber; and a heat transfer plate member which is not projected from the substrate and butts against a rear face of the substrate held by the substrate holding member to remove the substrate from the substrate holding member towards the thin film forming section, and conducts heat to the substrate.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

The fundamental structure of the plasma CVD system according to one concrete aspect of the present invention is similar to a general plasma CVD system. More specifically, the plasma CVD system is provided, in a processing chamber which can be vacuumized, with a thin film forming device having an electrode member for impressing a voltage to form plasma, a supplying device of reaction gas composing plasma, and a heating device for heating substrates, etc. Moreover, a substrate holding member, for example, a transfer pallet or a substrate tray for holding substrates is set inside the processing chamber in a manner to be freely brought in and out of the processing chamber by a transfer device such as a conveyor or the like. The substrate is a glass substrate or a substrate of the other generally used material corresponding to the purpose of the plasma CVD. Moreover, desired reaction gas is usable depending on the kind of a thin film to be formed.

According to the concrete aspect, a thin film forming section with the thin film forming device communicates with a transfer/heating section having the heating device and the transfer device at a connecting opening, but is disconnected with one another at the other portions. The size and the dimension of the connecting opening are so set that the connecting opening is filled approximately wholly when the substrate is placed at the connecting opening. The thin film forming device in the thin film forming section is positioned so as to deposit thin films towards the connecting opening. Concretely, the electrode member and the jet ports of the reaction gas are provided opposite to the connecting opening. Although a vacuumizing device in the processing chamber is designed to hold the state of a high degree of vacuum suitable for plasma CVD at the thin film forming section, the degree of vacuum may be lower at the transfer/heating section. Particularly, if inert gas is supplied to the transfer/heating section to keep the transfer/heating section at a higher pressure than the thin film forming section at the forming time of thin films, the reaction gas is positively prevented from leaking from the thin film forming section to the transfer/heating section through the connecting opening.

The holding member for substrates can be a substrate holding device generally used in various kinds of thin film forming apparatuses, e.g., the transfer pallet which holds the lying substrates in the outer periphery thereof or means for holding the substrates in the upright posture or suspended posture. It is to be noted here, however, that the substrate holding member is required to be able to transfer the substrates to the side of a heat transfer plate by the action of the heat transfer plate which will be described later.

The substrate holding member is sent into the processing chamber from outside of the chamber by a transfer device, e.g., a roller conveyor, a hanger conveyor or the like employed in general machinery. In the event that the plasma CVD system is provided with processing chambers such as a plurality of thin film forming chambers and pretreatment and posttreatment chambers, the transfer device is adapted to sequentially transfer the substrate holding member to each of the processing chambers. Although only one substrate holding member may be sequentially transferred into the processing chambers by the transfer device, a plurality of substrate holding members may also respectively be used to reciprocate only between the adjacent two processing chambers, and in this case, the substrates are transferred from one substrate holding member to the neighboring substrate holding member sequentially. Moreover, the substrate holding member may be rendered detachable from the transfer device, or the substrate holding member is formed integral with the transfer device.

The heat transfer plate butts against the rear face of the substrate held by the holding member. Specifically, the heat transfer plate is separated from the rear face of the substrate when the substrate and the substrate holding member are transferred by the transfer device, whereas the heat transfer plate is moved to butt against the rear face of the substrate upon necessities. The heat transfer plate is movable from the state in contact with the rear face of the substrate to transfer the substrate detached from the holding member to the position where the connecting opening is filled with the substrate. The heat transfer plate can be moved by a moving mechanism of a combination of a motor, a cylinder mechanism and the like, similar to the general machines. However, it should be so arranged that the substrate holding member or the transfer device does not interfere the heat transfer plate when the heat transfer plate operates, and the heat transfer plate does not bother the substrate holding member or the transfer device after the heat transfer plate is moved to the connecting opening.

The heat transfer plate can be heated freely. As the heating device for heating the heat transfer plate, a heating source such as a heater, etc. may be incorporated in the heat transfer plate, or a heating lamp may be used as will be depicted hereinbelow.

That is, according to the concrete aspect, the heat transfer plate is formed of metal of high heat absorption efficiency, without a heating source. A light permeable window is formed in the wall of the processing chamber confronting the heat transfer plate, and a heating lamp is provided outside the processing chamber adjacent to the light permeable window. The light from the heating lamp is illuminated on the rear face of the heat transfer plate through the light permeable window, thereby heating the heat transfer plate. Since the light permeable window is covered with a light permeable material, for example, quartz glass or the like, the light of the heating lamp is allowed to pass through the window favorably and at the same time, the processing chamber is maintained well in vacuum. When the heat transfer plate is to be heated, it is preferable that the heat transfer plate is brought to the light permeable window as close as possible to effectively absorb the radiation heat from the heating lamp.

The heat transfer plate may be utilized as an electrode opposite to the electrode member when a thin film is formed. That is, if the heat transfer plate is earthed or grounded, a thin film is satisfactorily deposited on the surface of the substrate because the heat transfer plate in touch with the rear face of the substrate confronts the electrode member to which the voltage is applied. It is needless to say, however, that an earthed electrode may be separately provided in touch with the substrate at the connecting opening.

In the concrete aspect, the thin film forming section is separated from the transfer/heating section except at the connecting opening, and the connecting opening is filled with the substrate at the forming time of thin films. Therefore, it is prevented that a thin film is formed also on the substrate holding member, the transfer device and the like structural parts, delaminated from the substrate holding member or the like and adhered to the surface of the substrate. Since the degree of vacuum and the temperature inside the thin film forming section are kept constant at all times, even if a thin film is adhered to the inner wall of the thin film forming section, this thin film never slips from the wall face.

The heat transfer plate transferring the substrate from the substrate holding member to the connecting opening conducts heat to the substrate as in touch with the substrate. Therefore, the thermal conduction from the heat transfer plate to the substrate is efficiently performed, without causing the waste of thermal energy. Moreover, sine the substrate is not in touch with the substrate holding member when the heat is transmitted from the heat transfer plate to the substrate, the heat never escapes to the substrate holding member, thereby increasing the efficiency of the thermal energy. When the substrate after a thin film is formed thereto is transferred to the substrate holding member from the heat transfer plate, the substrate separated from this heated heat transfer plate can be cooled quickly, and accordingly the cooling time is shortened and the energy for cooling is reduced.

As compared with the concrete aspect of the present invention, the conventional plasma CVD system takes time and energy to heat and cool the substrates 1. When the substrate 1 is heated by the heater panel 4, the heat is transmitted simultaneously to the substrate tray 2. Because of the relatively large thermal capacity of the substrate tray 2, the substrate tray 2 absorbs the thermal energy, and the substrate 1 is impossible to be quickly heated. An amount of the heating energy is wasted. In cooling the substrate 1, it is necessary to concurrently cool the substrate tray 2 of the large thermal capacity. Therefore, the cooling time is increased, which is wasteful with the cooling energy. Furthermore, if such a holding means as the substrate tray 2 is not employed to make only the substrate 1 heated and cooled, the time required for heating and cooling would be short enough and the consuming energy could be reduced. However, in the conventional technique, it is considerably difficult to handle the substrate 1 solely and is impossible to reliably transfer the substrate 1 to the processing chamber 3 or to form a thin film to the substrate 1 without hurting or deforming the substrate 1. There still remains an undesirable possibility that a thin film is formed and slipped off from the substrate 1 even in the arrangement as above.

In the conventional CVD system, the heater panel 4 is provided in the vacuum processing chamber 3 with a gap separated from the substrate 1. Therefore, the thermal conductivity from the heater panel 4 to the substrate 1 becomes poor. Since the heat of the heater panel 4 is transmitted mainly through conduction, the thermal conduction to the substrate 1 cannot be efficiently performed in the vacuum state. Additionally, when the conveyor line 2a is adapted to circulate in one direction through a plurality of processing chambers 3 and return back after running outside the processing chambers 3 as in FIG. 7, a large space is needed to install the conveyor line 2a.

Figure 3:
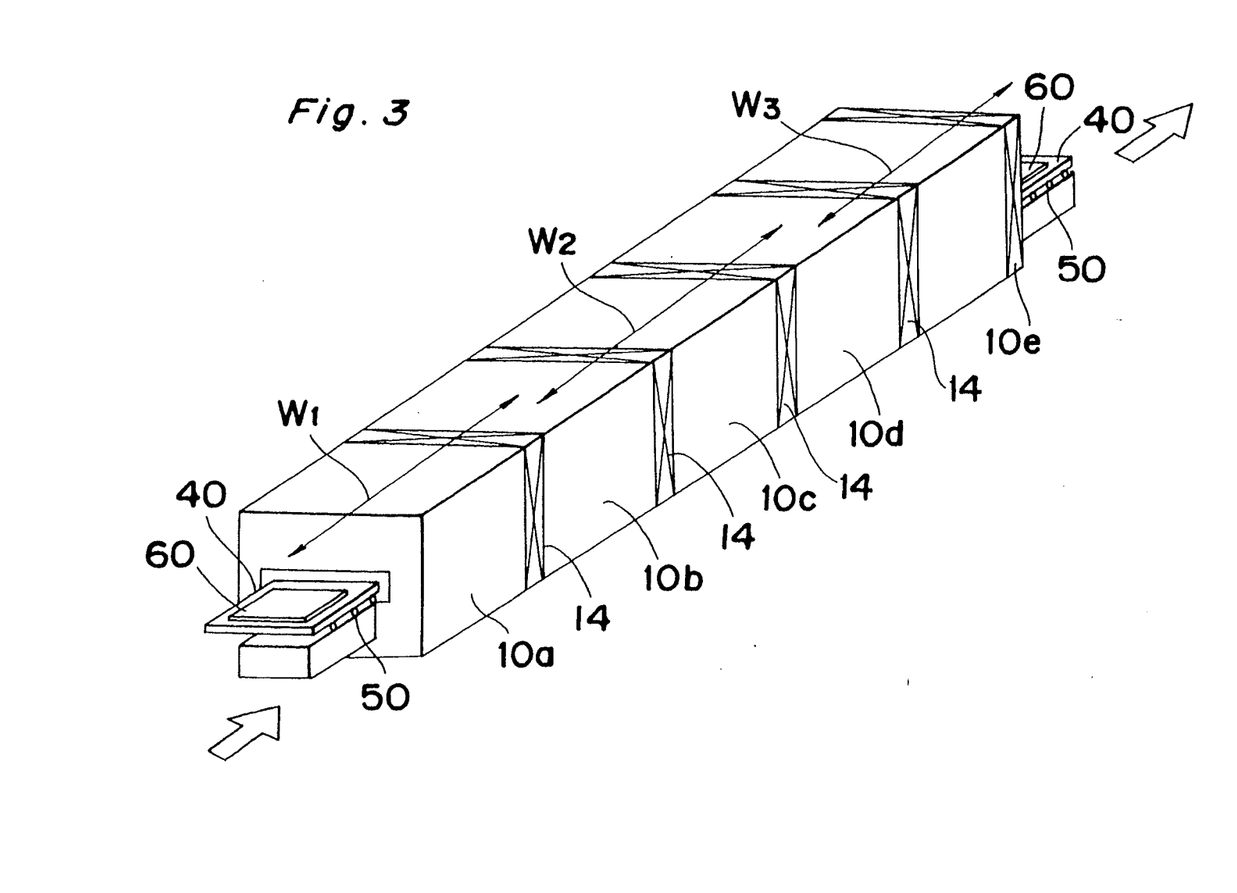
FIG. 3 is a perspective view showing the whole appearance of the system.

The total structure of a plasma CVD system of one embodiment of the present invention is shown in FIG. 3 for forming a large-scale liquid crystal device of a color thin film transistor. A preheating chamber 10a, a plurality of thin film forming chambers 10b, 10c, 10d, and a cooling chamber 10e are coupled one another via a chamber gate valve 14. A roller conveyor 50 as a transfer device has many guide rollers and runs through the processing chambers 10a, ..., 10e. A transfer pallet 40 as a substrate holding member is placed on the roller conveyor 50, and accommodates a substrate 60 to which a thin film is to be formed. While the substrate 60 is inserted from one end of the system and transferred through the processing chambers 10a, 10b, 10c, 10d in order, the substrate 60 is processed by predetermined treatments. The process-completed substrate 60 is sent out from the other end of the system. A first transfer pallet 40 from outside of the system reciprocates between the preheating chamber 10a and the succeeding thin film forming chamber 10b. That is, the first transfer pallet 40 reciprocates in the range W1 in FIG. 3. A second transfer pallet 40 is arranged to reciprocate between the thin film forming chamber 10b and the next thin film forming chamber 10c and between the thin film forming chamber 10c and the next thin film forming chamber 10d (in the range W2 in FIG. 3). A third transfer pallet 40 is arranged to reciprocate between the thin film forming chamber 10d and the cooling chamber 10e (in the range W3 in FIG. 3). Therefore, the substrate 60 is sequentially handed over from one transfer pallet 40 to the next transfer pallet 40 to transfer from one end to the other end of the system.

Figure 1:
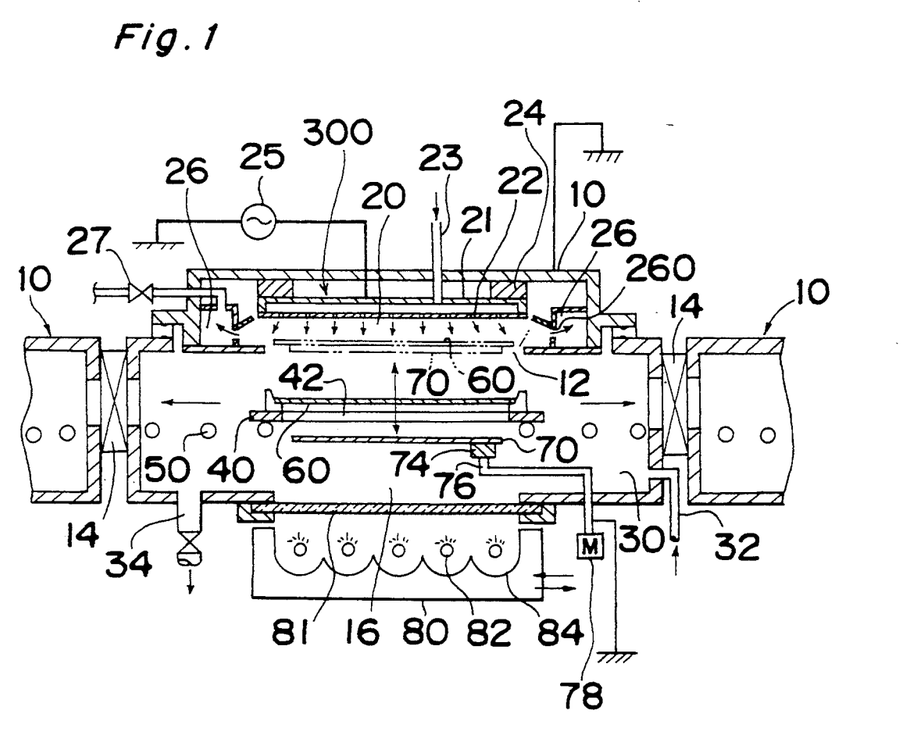
FIG. 1 is a sectional view showing the structure of a plasma CVD system according to one preferred embodiment of the present invention.

Referring now to FIG. 1, the internal structure of the thin film forming chamber 10 (10b, 10c, 10d) of the plasma CVD system will be depicted. The processing chamber 10 consists of a central transfer/heating section 30 and a thin film forming section 20 defined above the section 30.

The right and left ends of the transfer/heating section 30 are coupled to the adjacent processing chambers 10, 10a, or 10e via the chamber gate valves 14. The roller conveyor 50 transverses the transfer/heating section 30. The transfer/heating section 30 has a vacuum discharge port 34 and an inert gas introduction port 32. The transfer pallet 40 on the roller conveyor 50 is reciprocated in the horizontal direction by the action of the roller conveyor 50. The transfer pallet 40 reciprocates between the central processing chamber 10c and the adjacent processing chambers 10b and 10d before and after the central processing chamber 10c. The substrate 60 for which a thin film is to be formed is put on the transfer pallet 40.

A heat transfer plate 70 is disposed below the running course of the transfer pallet 40. The heat transfer plate 70 is mounted to a lifting arm 76 via a heat insulating member 74. The lifting arm 76 is freely moved up and down by a motor 78 or the like. The heat transfer plate 70 having good absorbing properties of the radiation heat is formed of conductive metal, etc. and is earthed to function as a lower electrode.

The lower wall of the processing chamber 10 below the heat transfer plate 70 is penetrated and a light permeable window 16 is formed there. A light permeable plate 81 made of quartz glass or the like is fitted into the light permeable window 16. There is a heating lamp 80 further below the light permeable window 16 outside the processing chamber 10. The heating lamp 80 has a source lamp 82 of a halogen lamp or an infrared lamp, and a reflecting plate 84, etc. The light projected from the heating lamp 80, passing through the light permeable plate 81, is incident on the heat transfer plate 70 in the processing chamber 10, so that the heat transfer plate 70 is heated by the radiation heat.

When the heat transfer plate 70 is moved upward, the heat transfer plate 70 passes through a space 42 penetrating the center of the transfer pallet 40 and butts against the rear face of the substrate 60. As the heat transfer plate 70 in touch with the substrate 60 is further moved upward, it picks up the substrate 60 above the transfer pallet 40 to the position to fill the connecting opening 12. The upper film forming section 20 and the lower transfer/heating section 30 are separated nearly in the sealed state when the substrate 60 is at the connecting opening 12. If the connecting opening 12 is completely sealed by the substrate 60 or the heat transfer plate 70, it is reliably prevented that the reaction gas leaks to the transfer/heating section 30. However, a little gap is no matter in practical use.

A gas exhaust plate 22 is set above the connecting opening 20 in the thin film forming section 20. Many holes are opened in the gas exhaust plate 22. An electrode member 21 as an upper electrode is located above the gas exhaust plate 22 through a gap. The electrode member 21 is connected to a high frequency power source 25 and fixed to the inner wall of the processing chamber 10 via an insulating material 24. The walls of the system are earthed. A reaction gas for forming thin films is supplied between the electrode member 21 and the gas exhaust plate 22 through a reaction gas introduction piping 23 connected to the electrode member 21.

A discharge path 26 of the reaction gas is formed in the outer periphery of the space between the gas exhaust plate 22 and the connecting opening 12. The discharge path 26 has many discharge holes 260 in the inner side faces of the discharge path 26. Moreover, the discharge path 26 is coupled to a discharge port 27. The reaction gas jetted out from the gas exhaust plate 22 is used so that thin films are deposited on the substrate 60 at the connecting opening 12, and then the unused gas is discharged outside from the discharge port 27 through discharge holes 260 of the discharge path 26.

Figure 2:
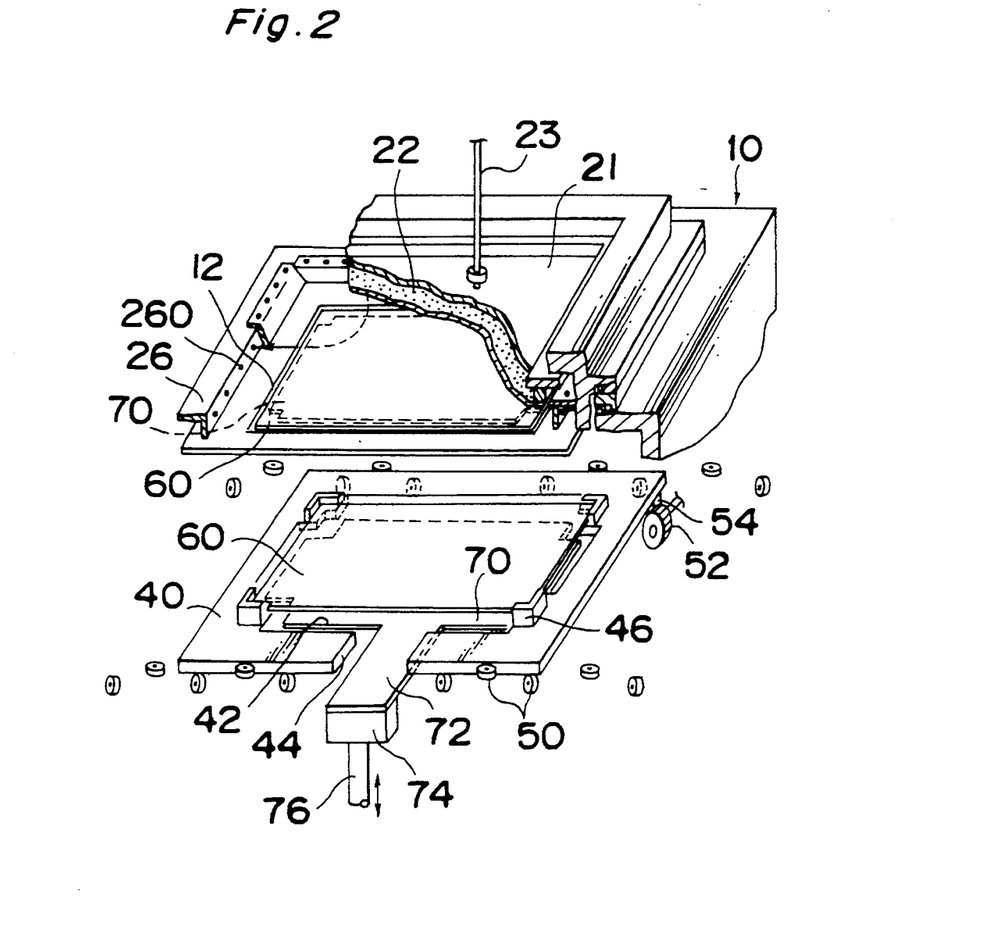
FIG. 2 is a partially-removed perspective view of the system.

FIG. 2 details the internal structure of the processing chamber 10.

The transfer pallet 40 is supported in a movable manner in the horizontal direction on the roller conveyor 50 which has many guide rollers. When a driving pinion 52 of the roller conveyor 50 is meshed with a rack 54 elongated in a transfer direction and secured to the transfer pallet 40, and rotated, the transfer pallet 40 reciprocates in the horizontal direction.

The space 42 in the center of the transfer pallet 40 is formed in conformity with the configuration of the substrate 60. A holding block 46 made of heat insulating material such as ceramic, etc. is provided in the transfer pallet 40 at the position corresponding to each corner of the substrate 60. The substrate 60 is placed on the transfer pallet 40 while fitted in the holding blocks 46 and held by the lower projections of the blocks 46.

The heat transfer plate 70 is slightly smaller than the central space 42 of the transfer pallet 40, with a projecting arm 72 at one side. The lifting arm 76 is fixed to the projecting arm 72 via a heat insulating member 74. The transfer pallet 40 has a notch 44 formed corresponding to the projecting arm 72 of the heat transfer plate 70. Therefore, the heat transfer plate 70 is freely moved up and down through the transfer pallet 40.

Figure 8:
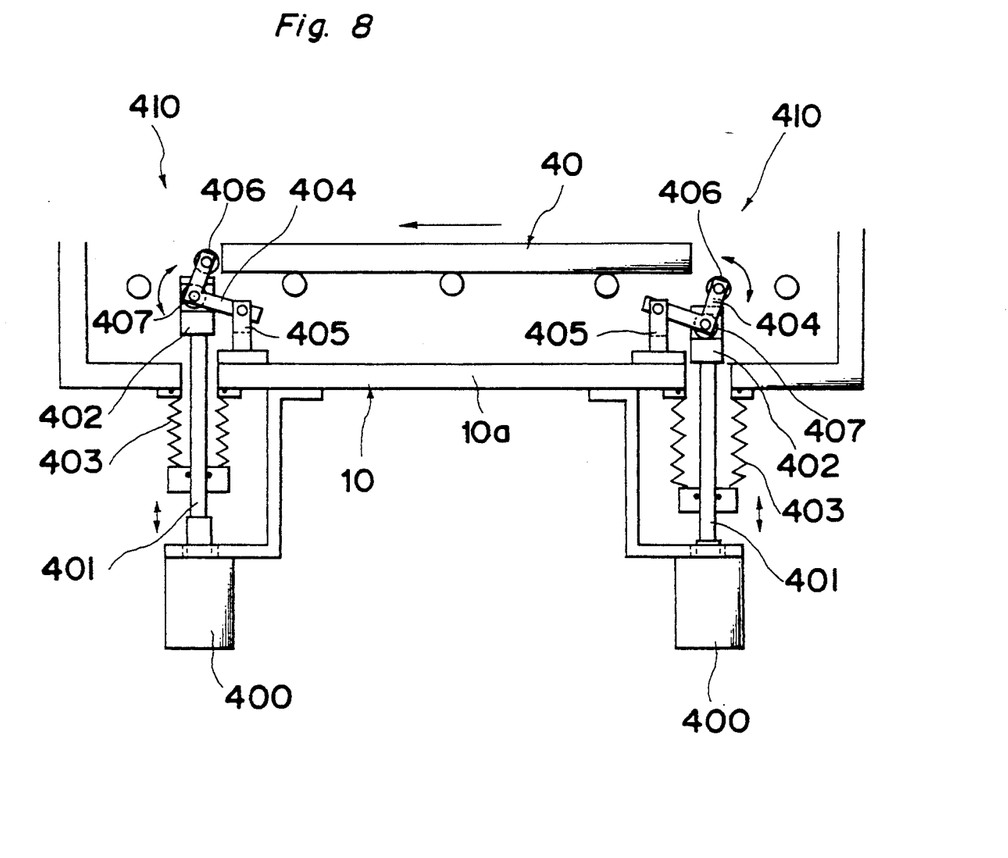
FIG. 8 is a side view of a positioning device of the embodiment.

Two positioning devices 410 are located in front of and behind a predetermined position where the heat transfer plate 70 butts against the rear face of the substrate 40. Each positioning device 410 arranged at the bottom of the processing chamber 10 is shown in FIG. 8 to locate the transfer pullet 40 at the predetermined position in the transfer/heating section 30. The positioning device 410 has an air cylinder 400 for moving up and down a driving rod 401 surrounded by bellows 403 and having a bracket 402. One end of an L-shaped positioning arm 404 is pivoted to a fixed projection 405 of the bottom of the processing chamber 10. Rollers 404 and 406 are rotatably mounted to a bent portion of the positioning arm 404 and an upper end thereof. According to this devices 410, when the driving rods 401 are moved up by the air cylinders 400, each positioning arm 404 is pivoted around the pivotal point of the fixed projection 405 by pushing the roller 407 at the bent portion of the positioning arm 404 by the bracket 402, and then the roller 406 at the upper end of each positioning arm 404 brings in contact with the front and rear ends of the transfer pullet 40 moved by the roller conveyer 50 in order to locate the transfer pullet 40 at the predetermined position. When the transfer pullet 40 is removed from the predetermined position, the driving reds 401 are moved down by the air cylinders 400 not to interrupt the forward or backward movement of the transfer pullet 40.

The operation of the plasma CVD system in the above-described structure will be discussed below.

In the first place, the heat transfer plate 70 is heated to a predetermined temperature by the illumination from the heating lamp 80, as described before. The heat transfer plate 70 is maintained at the predetermined temperature at all times from the illumination of the heating lamp 80 except when the heat transfer plate 70 moves upward.

When the substrate 60 on the transfer pallet 40 is carried in the processing chamber 10, the whole of gas accommodated in the processing chamber 10 is vacuumized through the vacuum discharge port 34. Then, the heat transfer plate 70 is raised to butt against the rear face of the substrate 60 and the substrate 60 is picked up from on the transfer pallet 40 to the position of the connecting opening 12. When the heat transfer plate 70 is in touch with the substrate 60, the substrate 60 is immediately heated because of the thermal conduction from the heat transfer plate 70.

An inert gas such as nitrogen gas is introduced from the inert gas introduction port 32 to the transfer/heating section 30, with the vacuum discharge port 34 closed.

Subsequently, the discharge port 27 of the thin film forming section 20 is opened and a reaction gas is fed through the reaction gas introduction piping 23. At this time, a voltage is impressed to the electrode member 21. As a result, by plasma of the reaction gas jetted out from the gas exhaust plate 22, a thin film is deposited on the surface of the substrate 60 which is earthed via the heat transfer plate 70, whereby a thin film of a predetermined thickness is formed thereon. In the embodiment, since the substrate 60 is positioned considerably close to the gas exhaust plate 22 and the electrode member 21, a good, high quality thin film is obtained in comparison with the case where the substrate 60 is positioned on the transfer pallet 40 at the forming time.

The reaction gas not used to form a thin film is discharged out through the discharge path 26 and the discharge port 27. The discharge path 26 is arranged immediately in the outer periphery of the substrate 60 and therefore, the reaction gas is positively guided to the discharge path 26, hardly leaking below through the connecting opening 12. Moreover, since the inert gas is fed to the transfer/heating section 30, the transfer/heating section 30 is higher in pressure than the thin film forming section 20, thus making it possible to prevent the leakage of the reaction gas from the connecting opening 12 to the transfer/heating section 30.

After the formation of the thin film is completed, the residual gas is discharged from the vacuum discharge port 34 in the transfer/heating section 30. The heat transfer plate 70 is moved down to return the substrate 60 on which the thin film is formed onto the transfer pallet 40. The whole of the gas in the processing chamber 10 is discharged through the vacuum discharge port 34.

The substrate 60 returned onto the transfer pallet 40 is, along with the movement of the transfer pallet 40, sent to the next processing chamber 10. The same thin film forming process as above is conducted in the next processing chamber 10. In this case, however, the transfer pallet 40 is returned to the previous processing chamber after the substrate 60 is changed onto the heat transfer plate 70 from the transfer pallet 40, and further moved back to the processing chamber 10 preceding the previous processing chamber 10, where a succeeding substrate 60 to be processed is received. In other words, the transfer pallet 40 is reciprocated while the substrate 60 is held by the heat transfer plate 70. Therefore, the time loss in the reciprocating motion of the transfer pallet 40 is restricted to be minimum.

Referring to FIG. 3, the transfer pallet 40 reciprocating through the thin film forming chambers 10b, 10c, 10d (in the range W2 in FIG. 3) is set approximately at the constant temperature and constant degree of vacuum. Therefore, even if a thin film is formed also onto the transfer pallet 40, the film never slips from the transfer pallet 40 and accordingly never adheres to the surface of the substrate 60.

For the transfer device of the substrate 60, according to the embodiment, the roller conveyor 50 is used to run through each of the processing chambers 10a–10e, and a plurality of transfer pallets 40 are reciprocated every predetermined range on the roller conveyor 50. Therefore, a return line of the transfer pallet 40 conventionally required in a loop conveyor is not necessary outside the system, and the space to install the plasma CVD system is reduced. Moreover, as described earlier, even if a thin film is formed on the transfer pallet 40 reciprocating through the thin film forming chambers 10b, 10c, 10d, the thin film is never detached from the transfer pallet 40, thereby effectively maintaining the quality of the substrate 60 and saving trouble to remove the thin film of the transfer pallet 40.

An example of the large-scale liquid crystal display of a color thin film transistor has three layers, a first layer of SiN, a second layer of amorphous-Si, and a third layer of SiN. The pressure for forming the first layer is 1.0–4.5 Torr, preferably 3 Torr. The pressure for forming the second layer is 1.0–3.0 Torr, preferably 2 Torr. The pressure for forming the third layer is 1.0–4.5 Torr, preferably 3 Torr. The gas flow rate for forming the first layer is $SiH_4$ of 200–300 SCCM, preferably 250 SCCM, $NH_3$ of 400–500 SCCM, preferably 450 SCCM, and $N_2$ of 1,000–2,000 SCCM, preferably 1,500 SCCM. The gas flow rate for forming the second layer is $SiH_4$ of 100–200 SCCM, preferably 150. The gas flow rate for forming the third layer is $SiH_4$ of 200–300 SCCM, preferably 250 SCCM, $NH_3$ of 400–450 SCCM, preferably 450 SCCM, and $N_2$ of 1,000–2,000 SCCM, preferably 1,500 SCCM. The substrate is heated to 300° C. for forming the first layer, to 300° C. for forming the second layer, and to 250° C. for forming the third layer. The degree of vacuum in the processing chamber before forming a thin film is $5 \times 10^{-5}$ Torr by a turbo-pump discharge operation.

Figure 4:
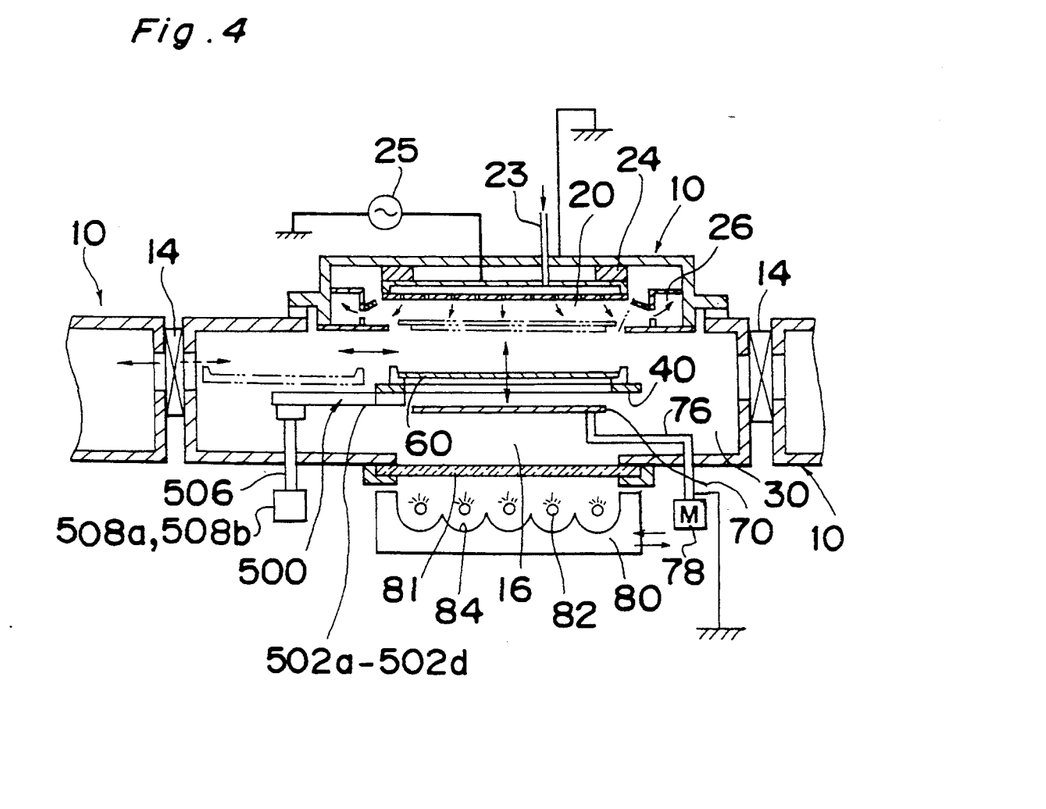
FIG. 4 is a sectional view showing the structure of a plasma CVD system according to a different embodiment of the present invention.
Figure 5:
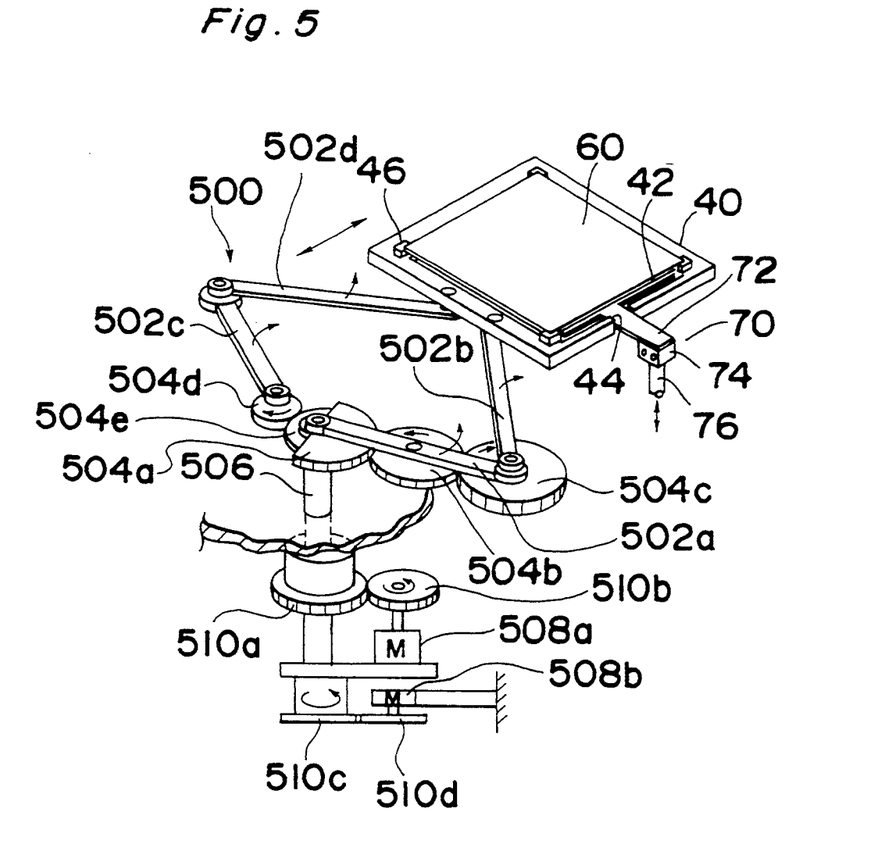
FIG. 5 is a perspective view showing the structure of a transfer arm.

A further embodiment of the plasma CVD system is shown in FIGS. 4 and 5, wherein the structure of the transfer device of the substrate 60 is different. A transfer arm 500 is employed in place of the roller conveyor 50 according to the modified embodiment. Since the other structures than the transfer arm 500 are the same as in the foregoing embodiment, the description thereof will be abbreviated here.

The transfer arm 500 includes four arm members 502a, 502b, 502c, and 502d and a gear mechanism having arm gears 504a, 504b, 504c, 504d, and 504e for bending the arm members 502a–502d. The arm gears 504a and 504b and the arm gears 504b and 504c are respectively engaged with each other. The arm gears 504d and 504e are engaged with each other. The arm gear 504c is fixed to the arm member 502b and the arm gear 504d is fixed onto the arm member 502c. The whole of the arm members 502a–502d is rotated by a motor 508a through gears 510b and 510a. A driving shaft 506 coupled to the arm gears 504a and 504e and rotatable independent of the rotation of the motor 508a is driven by a motor 508b through gears 510d and 510c. When the driving shaft 506 is rotated by the motor 508b through the gears 510d and 510c, the arm gears 504a–504e are rotated to bend or stretch the arms 502a–502d. The transfer pallet 40 is rotatably and fixedly mounted at the front ends of the arm members 502b and 502d. As the arm members 502a–502d bend and stretch, the transfer pallet 40 is horizontally reciprocated.

As indicated in FIG. 4, while the transfer arm 500 extends rightward in FIG. 4, the transfer pallet 40 mounted to the transfer arm 500 is positioned at the center of the processing chamber 10, namely, above the heat transfer plate 70. When the transfer arm 500 contracts, the transfer pallet 40 is moved to the position above the driving shaft 506. When the transfer arm 500 extends in the opposite direction i.e. leftward in FIG. 4, it allows the transfer pallet 40 to enter the next processing chamber 10, that is, the substrate 60 is transferred to the next processing chamber 10. If the maximum extending length of the transfer arm 500 is set suitably, it becomes possible to sequentially transfer the substrate 60 to each transfer arm 500 in the processing chamber 10.

According to modification of the present invention, the discharge flow rate of the discharge path 26 is larger than the flow rate of gas flowed from the transfer/heating section 30 into the thin film forming section 20 through a gap between the connecting opening 12 and the substrate 60 positioned at the connecting opening 12.

According to another modification of the present invention, the whole area of discharge holes of the discharge path 26 is larger than the whole area of the gap formed between the connecting opening 12 and the substrate 60.

According to a further modification of the present invention, the pressure in the discharge path 26 is lower than the pressure in other regions in the processing chamber 10.

According to a still further modification of the present invention, the heat transfer plate 70 has a heater in place of the heating lamp 80. The heater may be constructed by a sheathed heater buried in the plate itself or attached to the lower surface of the plate.

Figure 9:
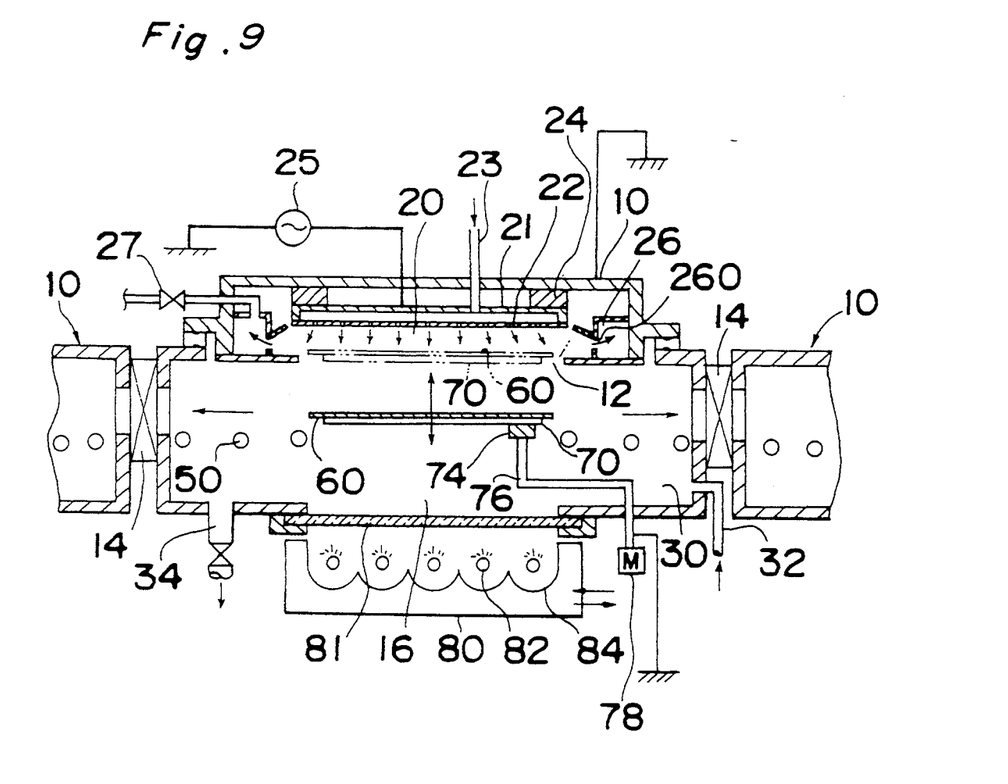
FIG. 9 is a sectional view showing the structure of a plasma CVD system according to modification of the present invention.

In one aspect of the present invention, as shown in FIG. 9, the system has the heat transfer plate 70 which is not projected from the substrate and butts against a rear face of the substrate 60 held by the transfer pullet 40 to remove the substrate 60 from the transfer pullet 40 to form the thin film, and conducts heat to the substrate 60. That is, the heat transfer plate 70 can be covered with the substrate 60, and thus it is prevented that a thin film is formed on the transfer pullet 40 or the like in the transfer/heating section 30 and drops to adhere to the surface of the substrate 60, to deteriorate the quality of the substrate 60.

In the plasma CVD system of the present invention, a thin film is formed on a substrate in the thin film forming chamber while the connecting opening where the thin film forming section communicates with the transfer/heating section is filled with the substrate. Therefore, it is prevented that a thin film is formed also on the substrate holding member or the like in the transfer/heating section and drops to adhere to the surface of the substrate, to deteriorate the quality of the substrate.

At the forming time of thin films, it is only required to set the internal space of the thin film forming section at the necessary degree of vacuum without regulating the atmosphere in the whole of the processing chambers. Therefore, the formation of thin films is carried out easily.

Since the substrate is transferred from the substrate holding member to the heat transfer plate which butts against the rear face of the substrate, the substrate is quickly heated through the conduction of heat from the heat transfer plate. At this time, the heat never escapes to the substrate holding member, thus achieving good efficiency of the thermal conduction and effective utilization of the thermal energy. Furthermore, the substrate of a small thermal capacity is promptly cooled as soon as it is separated from the heat transfer plate. The cooling time is consequently shortened and the energy for cooling is not required. Accordingly, the heating/cooling mechanism is simplified and the consuming energy is decreased, with remarkably cutting the installation cost and the driving cost of the plasma CVD system.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma CVD system comprising:
    a processing chamber having a thin film forming section and a transfer section communicating with the thin film forming section through a connecting opening;
    reaction gas introduction piping open to the interior of said thin film forming section;
    an electrode located in the thin film forming section;
    a substrate holding member which supports a substrate;
    a transfer device, located in the transfer section, for bringing the substrate holding member into and out of the processing chamber;
    a heat transfer plate; and
    drive means for moving said heat transfer plate into abutment with a rear surface of a substrate held by the substrate holding member so that the heat transfer plate will conduct heat to the substrate and for moving the heat transfer plate from the substrate holding member towards said thin film forming section to move the substrate to the thin film forming section.

2. The plasma CVD system as claimed in claim 1, wherein the heat transfer plate is grounded so as to serve as a lower electrode in opposition to said electrode located in the thin film forming section.

3. The plasma CVD system as claimed in claim 1, wherein said drive means moves the heat transfer plate to a position occupying the connecting opening.

4. The plasma CVD system as claimed in claim 3, and further comprising a reaction gas introduction manifold disposed in the thin film forming section and connected to an end of said reaction gas introduction piping, a reaction gas discharge port open to said thin film section, and an inert gas introduction port open to the interior of the transfer section.

5. The plasma CVD system as claimed in claim 3, and further comprising a reaction gas introduction manifold disposed in the thin film forming section and connected to an end of said reaction gas introduction piping, a reaction gas discharge manifold having a plurality of discharge holes disposed in said thin film forming section, and an inert gas introduction port open to the interior of the transfer section.

6. The plasma CVD system as claimed in claim 3, and further comprising a reaction gas introduction manifold disposed in the thin film forming section and connected to an end of the reaction gas introduction piping, and a reaction gas discharge manifold having a plurality of discharge holes disposed in said thin film forming section.

7. The plasma CVD system as claimed in claim 1, wherein said drive means raises the heat transfer plate from the substrate holding member to a position occupying the connecting opening and lowers the heat transfer plate from said position to a position below the substrate holding member.

8. The plasma CVD system as claimed in claim 1, wherein the heat transfer plate member is grounded so as to serve as a lower electrode in opposition to said electrode located in the thin film forming section, and said drive means raises the heat transfer plate from the substrate holding member to a position occupying the connecting opening and lowers the heat transfer plate from said position to a position below the substrate holding member.

9. A plasma CVD system comprising: thin film forming means for forming a thin film on a substrate; a substrate holding member which supports a substrate in the system; a heat transfer plate; and drive means for moving said heat transfer plate against a rear surface of substrate held by the substrate holding member so that the heat transfer plate will conduct heat to the substrate and for moving the heat transfer plate to move the substrate from the substrate holding member to the thin film forming means.

* * * * *